United States Patent [19]

Sangsingkeow

[11] Patent Number: 5,757,007
[45] Date of Patent: May 26, 1998

[54] SEGMENTED ELECTRODE RADIATION DETECTOR

[75] Inventor: Pat Sangsingkeow, Knoxville, Tenn.

[73] Assignee: EG&G Instruments, Inc., Oak Ridge, Tenn.

[21] Appl. No.: 833,303

[22] Filed: Apr. 4, 1997

[51] Int. Cl.$^6$ ............................................. G01N 23/04
[52] U.S. Cl. ............................ 250/370.01; 250/370.01
[58] Field of Search .......................... 250/370.1, 370.01

*Primary Examiner*—Craig E. Church
*Attorney, Agent, or Firm*—Iandiorio & Teska

[57] ABSTRACT

The segmented electrode radiation detector includes a semiconductor diode; an internal recess having a decreasing cross-sectional area extending at least partially axially into the diode. The plurality of inner electrode segments disposed axially spaced from each other on the surface of the recess and electrically isolated from each other for defining a plurality of axially discrete detection zones.

16 Claims, 4 Drawing Sheets

SEGMENTED ELECTRODE RADIATION DETECTOR

FIELD OF INVENTION

This invention relates to a segmented electrode radiation detector and more particularly to a segmented electrode radiation detector whose inner electrode is axially segmented to define a number of axially discrete detection zones.

BACKGROUND OF INVENTION

High-purity germanium (HPGe) detectors (G. F. Knoll, *Radiation Detectors and Measurements*, Chapters 2, 4, 11 and 12, Wiley 1989) are frequently used in energy spectroscopy and related fields to detect gamma rays or other high-energy photons. These detectors essentially consist of a large germanium diode made from germanium which is very highly purified, and lightly doped. The germanium is crystal machined in a desired shape, such as planar or coaxial. Electrodes are applied to opposing contacts of the detector, one of which is a rectifying electrode formed of p+ or n+ germanium material, depending on the doping of the bulk germanium. A reverse-bias voltage is applied to the electrodes. The voltage is sufficiently high to cause all of the volume of the germanium to be depleted (i.e., under an electric field). Gamma rays impinging upon the detector will collide with the germanium atoms, causing hole-electron carrier pairs to be created. These hole and electrons are collected by the electrodes. The total charge collected by the electrodes is related to the energy of the detected photons.

The energy resolution of these detectors as gamma ray spectrometers is extremely good. For example, for gamma rays of 1 MeV of energy, the energy resolution, measured as the full width half maximum of the gaussian peak generated by the detector-electronics system, is better than two parts per thousand. Also, these detectors are now available in very large size (cylinders of 8 cm diameter by 8 cm length) and have therefore, a high gamma detection efficiency.

Therefore, notwithstanding the high price and the inconvenience of cooling the detectors to low temperature, they are the detector of choice in nuclear structure studies. Such studies are nowadays conducted with large arrays ("Gammasphere" at LBL-USA, "Euroball" at Legnaro-Italy, etc.) where 100 or more detectors are mounted in a spherical structure. In such experiments, the target, at the center of the sphere, is bombarded with fast heavy ions generating gamma rays which provide the information sought by the scientists. However, the nuclei also recoil while emitting gamma rays which cause the emitted gamma energy lines to be broadened by Doppler shift. The only way to mitigate the imprecision caused by the Doppler shift is to correct the spectra by identifying where in the detector the event takes place. This also adds the benefit of complete tracking of the gamma rays inside the detector, thus distinguishing between multiple interactions of a single hit and multiple hits (*Nuclear Instruments and Methods in Physics Research*, A371 489–496 1996).

One modification proposed and tried for obtaining position information is segmentation, i.e., dividing the outer and/or the inner contact into two or more conducting surfaces electrically insulated from each other by thin separation lines.

Segmenting the inner electrode has been done with some success but not without difficulties and is rather time consuming. In addition, processing defects are not discernable until well into the manufacturing process when much time, expense and efforts have been invested. And even then the real cause of a failure cannot be determined easily or with certainty. The technique involves creating an axial hole or recess part way through the detector diode, providing an inner electrode on the surface of the recess by lithium doping and then carefully cutting a peripheral gap or slot part way down the recess or hole to divide the inner electrode into two or more axially distinct electrode segments to create two or more unique detector zones. The peripheral cut or cuts made to electrically isolate the electrode segments give rise to a number of problems. The peripheral slot cut in the inner electrode is quite narrow so that the etchant is often prevented by surface tension from entering and chemically machining the slot thereby leaving it rough and subject to high leakage current. The size and location of the slot make mechanical machining and chemical machining difficult to reproduce with the accuracy needed for a proper manufacturing procedure. Further there is an area of the diode detector commensurate with the slot width where the diode detector is not responsive because in the shadow of the slot there is no electric field and detection cannot occur. Because of the hidden location of the slot it is difficult to inspect it for possible flaws or defects which could produce failure so that often it is only during test after ten or more days of manufacturing processes that it can be determined whether or not a particular detector is defective.

SUMMARY OF INVENTION

It is therefore an object of this invention to provide an improved segmented inner electrode radiation detector.

It is a further object of this invention to provide such a segmented inner electrode radiation detector which is easy to make and inspect even at earlier manufacturing stages.

It is a further object of this invention to provide such a segmented inner electrode radiation detector which enables proper, predictable chemical etching of the area between segments of the segmented electrode.

It is a further object of this invention to provide such a segmented inner electrode radiation detector which reduces the diminished electric field areas between electrode segments.

This invention results from the realization that a truly improved radiation detector, which is easier to manufacture and yet provides increased radiation event position detection resolution in the axial dimension can be effected by segmenting the inner electrode of the semiconductor diode, and more particularly by the realization that by segmenting in the axial dimension the inner electrode disposed along an inner recess and constructing the inner recess with a decreasing cross sectional area, a plurality of axially discrete detection zones can be created in the detector.

This invention features a segmented electrode diode radiation detector including a semiconductor diode having an internal recess with a decreasing cross-sectional area extending at least partially axially into the diode. There is a plurality of inner electrode segments disposed axially spaced from each other on the surface of the recess and electrically isolated from each other for defining a plurality of axially discrete detection zones.

In a preferred embodiment the semiconductor may include germanium and even more specifically an N-type germanium. The recess may have a plurality of successively cross-section area sections. The sections may be separated by step portions. The step portions may be made of non-conductive material. The step portions may be generally transverse to the actual dimension of the recess. The recess may be generally centrally disposed to the semiconductor diode and the recess may be generally coaxial with the axial dimension axis of the recess. The recess may be generally cylindrical in cross-section and the sections may be generally cylindrical in cross-section as well. The recess may be generally conical. The adjacent electrode segments may be separated by nonconducting segments. The electrode segments may be made of diffused lithium. The semiconductor diode also may include an outer electrode. The semiconductor diode may be cylindrical. The outer electrode may be implanted boron.

DISCLOSURE OF PREFERRED EMBODIMENT

Other objects, features and advantages will occur to those skilled in the art from the following description of a preferred embodiment and the accompanying drawings, in which.

Figure 1:
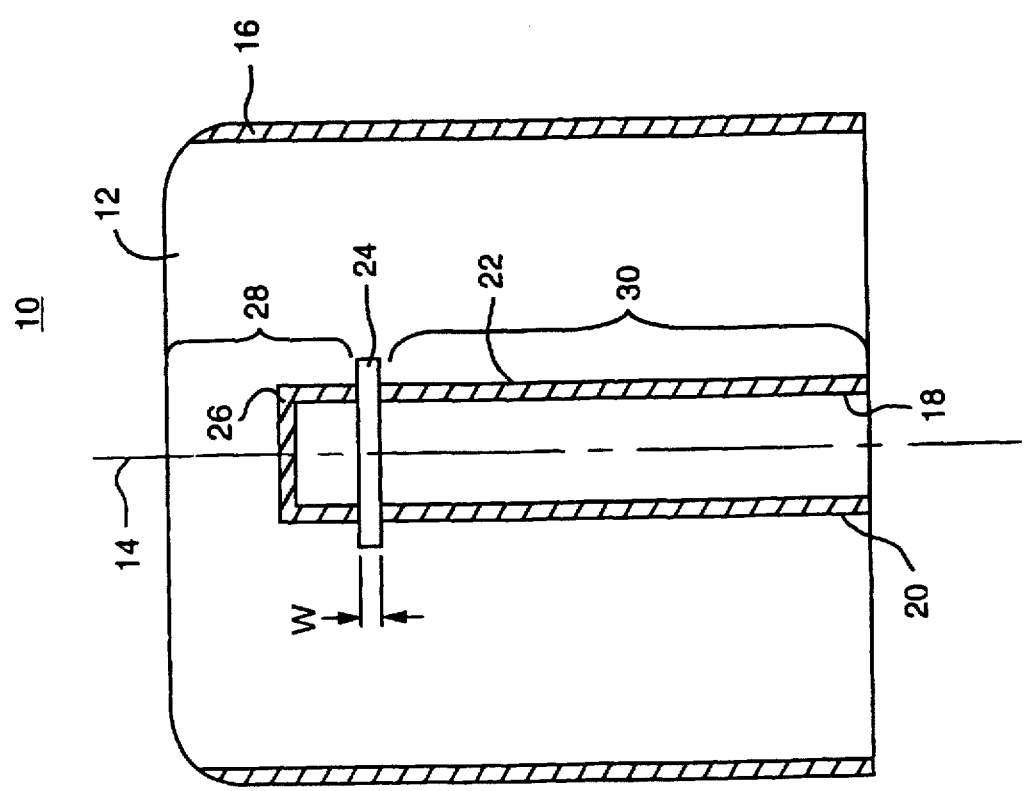
FIG. 1 is a schematic cross-sectional view of a prior art radiation detector.

There is shown in FIG. 1 a prior art radiation detector 10 formed of an N-type germanium medium 12 which is generally cylindrical and circularly symmetric about the center line or axial axis 14. An outer electrode 16 also conformingly cylindrical in shape is formed by boron implantation on the outside of N-type germanium medium 12. On the inside there is an inner electrode 18 formed on the inner surface of recess 20 which extends axially part way into medium 12 and is also cylindrical and coaxial with the axial dimension axis 14, medium 12 and outer electrode 16. Electrode 18 is formed by lithium diffusion.

Electrode 18 is formed in two segments, segment 22 below gap 24 and segment 26 above gap 24. Outer electrode 16 is typically about 0.3 microns thick. Inner electrode 18 is typically 800 microns thick. Medium 12 may be approximately 8 centimeters long and roughly 8 centimeters in diameter. Recess 20 may be approximately 8 millimeters in diameter. The creation of cut or gap 24 removes the lithium diffusion so that the space between segments 22 and 26 is occupied only by germanium which is not a good conductor and so electrode segments 22 and 26 constitute separate and distinct electrodes.

By this construction then, medium 12 of detector diode 10 exhibits two distinct detection zones, one, zone 28, proximate electrode segment 26 another, zone 30, proximate electrode segment 22. In this way the resolution is improved because the radiation events can be detected as occurring in either zone 28, or zone 30. Prior to the institution of this technique of employing one or more gaps 24 to create two or more electrode segments no distinction could be made as to the axial location of a radiation detection event. All that could be determined was that it struck somewhere in the germanium medium 12 along the entire extent of the axial axis 14.

One of the problems with this prior art construction technique is that is very difficult to form cut or gap 24 and after it is formed it is also very difficult to chemically machine or etch it in order to smooth it and prevent unacceptable leakage currents. Typically the chemical machining or etching problem is aggravated by the fact that the gap 24 is very narrow and is difficult to access. In addition, the width w of gap 24 creates a zone of either weak or no field in the germanium medium 12 so that detection is poor or undependable.

Figure 2:
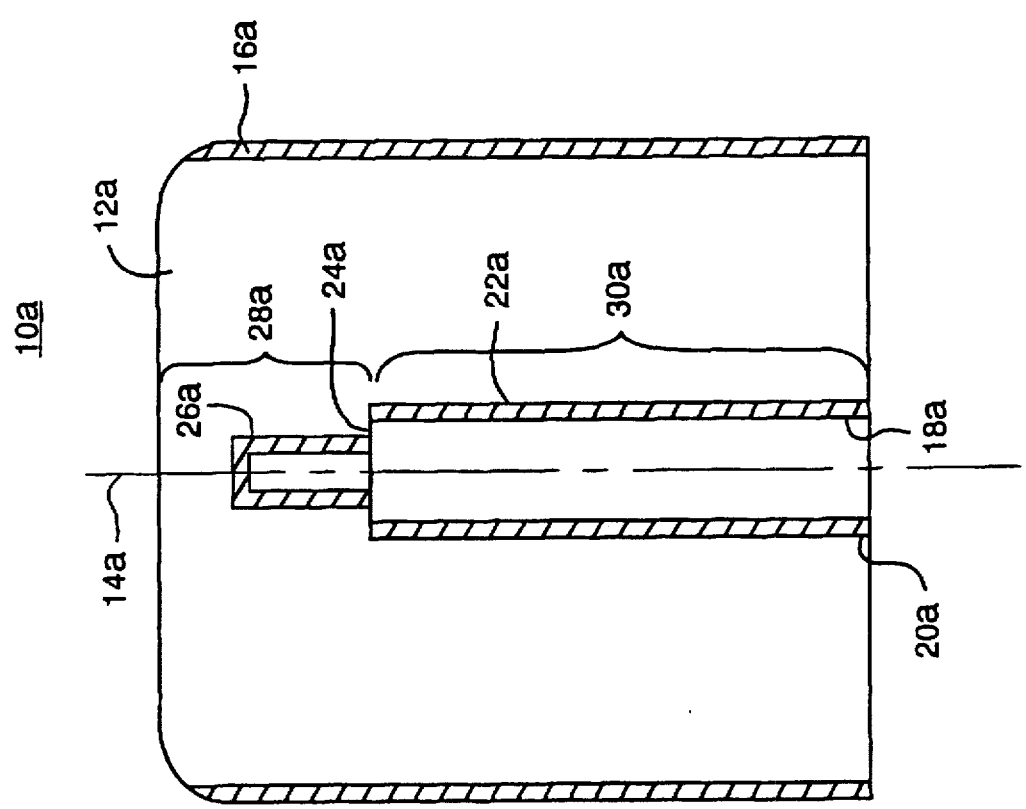
FIG. 2 is a view similar to FIG. 1 of a radiation detector with a stepped cylindrical axially segmented inner electrode according to this invention.

In accordance with this invention cut or gap 24 is eliminated in diode detector 10a, FIG. 2 by providing recess 20a with a diminishing cross-sectional area so that a shoulder or step 24a is created to provide the separation between electrode segment 26a and electrode segment 22a. Step 24a is easily mechanically machined without the difficulty attendant on the mechanical machining of gap 24. Further the etching or chemical machining of step 24a is also easily accomplished as compared to the etching of gap 24. And there is virtually no axial width W to gap 24a in FIG. 2 so there is no volume or zone wherein there is weak or no electric field between the inner electrode 18a and outer electrode 16a.

Figure 3:
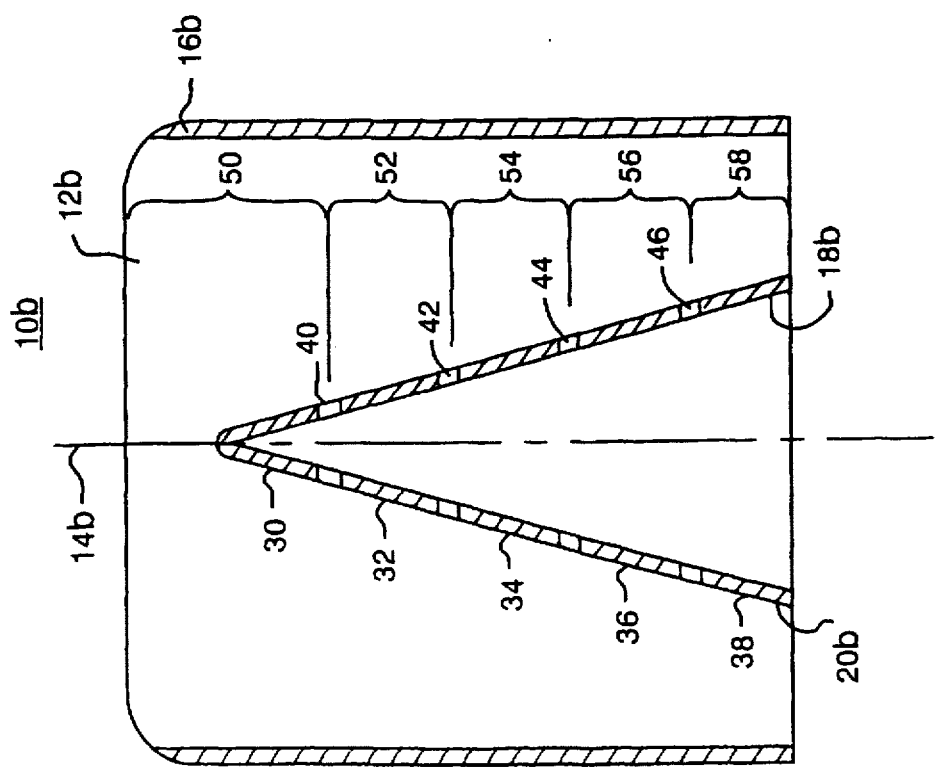
FIG. 3 is a view similar to FIG. 2 of a radiation detector with a conical axially segmented inner electrode according to this invention.

The geometry of recess 20a and electrode 18a need not be restricted to a single step configuration and in fact, the segments need not even be cylindrical, for as shown in FIG. 3, recess 20b and inner electrode 18b can be conical in shape having a plurality of electrode segments 30, 32, 34, 36 and 38 separated electrically by grooves 40, 42, 44 and 46 arranged to create five distinct detector zones, 50, 52, 54, 56 and 58.

Figure 4:
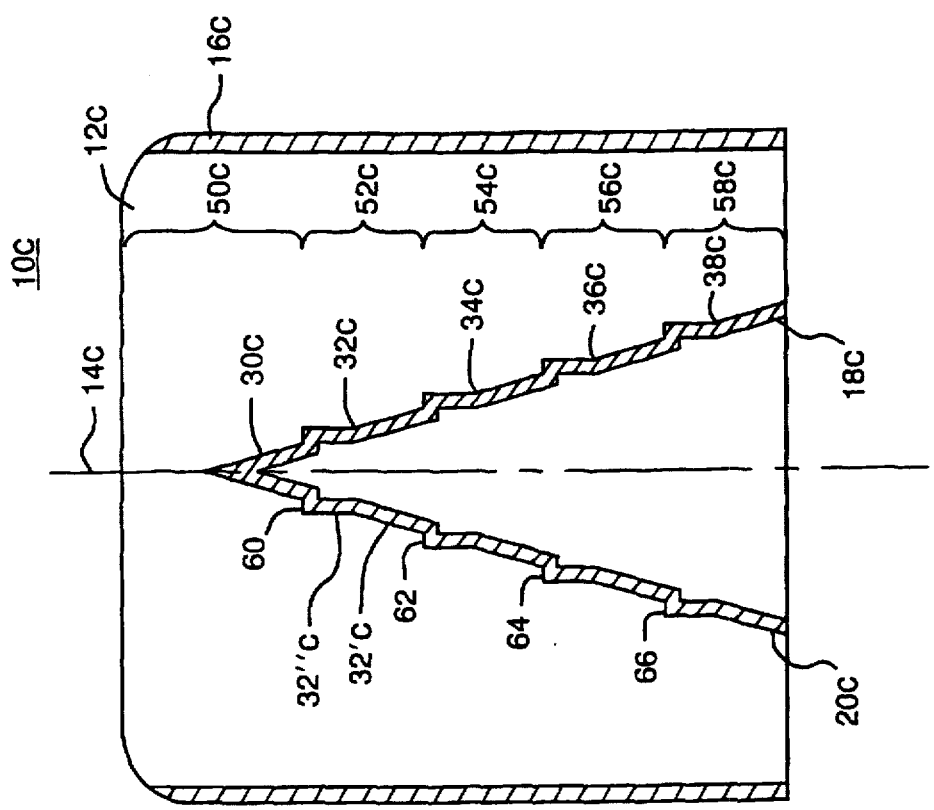
FIG. 4 is a view similar to FIG. 3 of a radiation detector with a stepped conical axially segmented inner electrode according to this invention.

In another construction, FIG. 4, recess 20c and electrode 18c are generally conical but the individual electrode segments 30c, 32c, 34c, 36c and 38c are partially conical as shown at 32'c and partially cylindrical as shown at 32"c so that an electrically separating or isolating step 60, 62, 64, 66 similar to the step construction in FIG. 2 is formed. Various other contours having decreasing cross-sectional area can be used. Although recess 20a, b and c and electrodes 18a, b and c have been shown as circularly symmetrical about the axial dimension axis 14a, b and c respectively, this is not a necessary limitation of the invention as they may be parallel to but not coaxial with that axis or may be tilted or both with respect to that axis and need not even be centrally located. This improved internal segmentation geometry, when located off-centered, will also provide position information when integrated with appropriate processing electronics.

Figure 5:
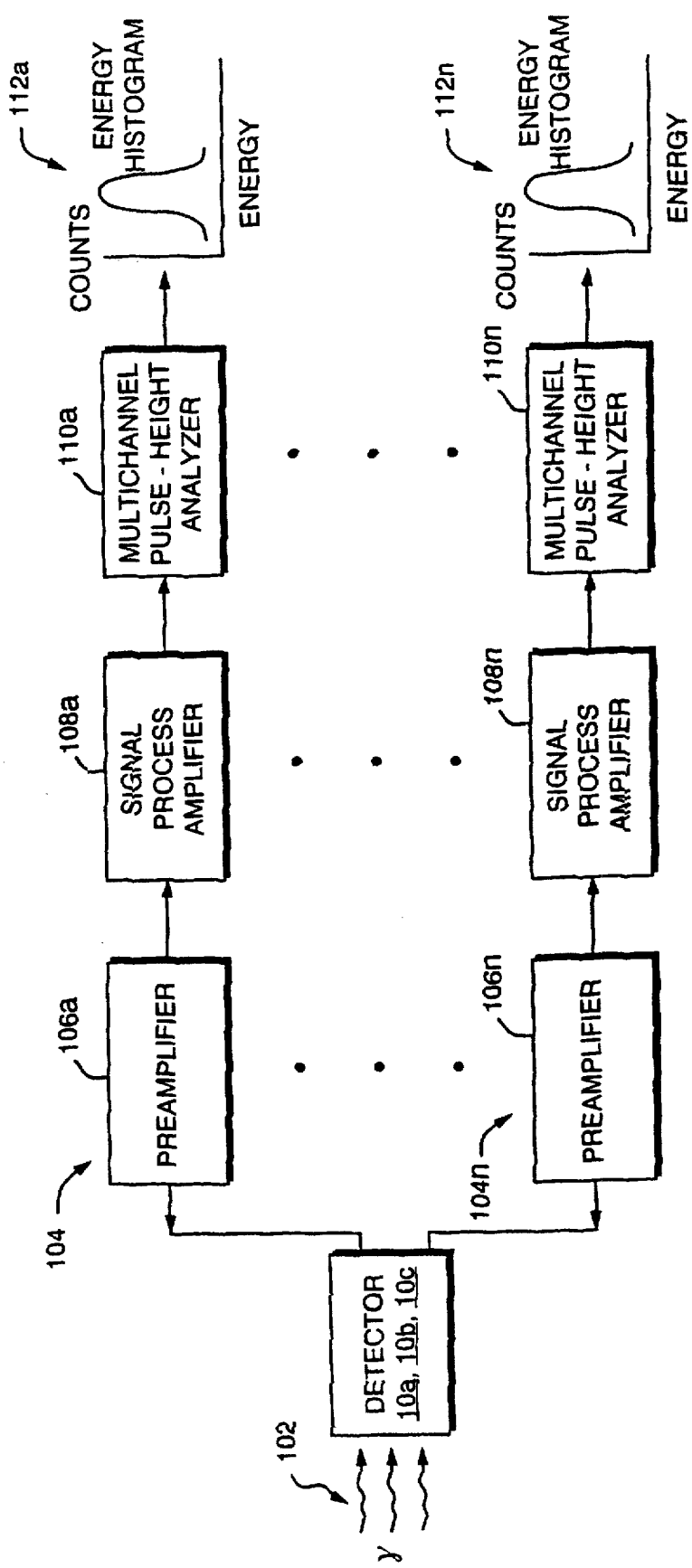
FIG. 5 is a schematic block diagram of a radiation detection system using a radiation detector according to this invention.

Typically, detector 10a, b or c as prior art detector 14 may be used in a radiation detector system 100, FIG. 5, in which incoming radiation, such as gamma radiation 102, is detected by detector 10a, b or c discretely for each segment so that detector 10a, b or c has an output for each electrode segment to a separate channel 104a–104n where n is the number of channels and the number of electrode segments. Each channel includes a preamplifier 106 which receives the signal from its associated electrode segment, amplifies it and delivers it to signal processor 108a which provides a properly shaped and timed digital signal to a multi-channel pulse height analyzer 110a which typically includes a microprocessor. The output typically provides an energy histogram of counts vs. energy as indicated in graph 112a which represents the profile of the radiation detected in the zone associated with that particular electrode segment. The actual system of FIG. 5 is not a part of this invention but is shown only to complete the understanding of the use of the detector. Typical systems such as depicted in FIG. 5 can be found in U.S. Pat. No. 4,866,400 and are available from a number of companies such as EG&G Instruments, Inc.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A segmented electrode radiation detector comprising:
   a semiconductive diode;
   an internal recess having a decreasing cross-sectional area extending at least partially axially into said diode; and
   a plurality of inner electrode segments disposed axially spaced from each other on the surface of said recess and electrically isolated from each other for defining a plurality of axially discrete detection zones.

2. The segmented electrode radiation detector of claim 1 in which said semiconductor diode is germanium.

3. The segmented electrode radiation detector of claim 1 in which said recess has a plurality of successively smaller cross-section area sections.

4. The segmented electrode radiation detector of claim 3 in which said sections are separated by stepped portions.

5. The segmented electrode radiation detector of claim 3 in which said stepped portions are non-conductive material.

6. The segmented electrode radiation detector of claim 3 in which said stepped portions are generally transverse to the axial dimension of said recess.

7. The segmented electrode radiation detector of claim 1 in which said recess is generally centrally disposed in said semiconductor diode.

8. The segmented electrode radiation detector of claim 1 in which said recess is coaxial to the axial dimension axis of said recess.

9. The segmented electrode radiation detector of claim 4 in which said recess is generally cylindrical in cross-section and said sections are generally cylindrical in cross-section.

10. The segmented electrode radiation detector of claim 3 in which said recess is generally conical.

11. The segmented electrode radiation detector of claim 10 in which adjacent said electrode segments are separated by non-conducting segments.

12. The segmented electrode radiation detector of claim 2 in which said diode is N type germanium.

13. The segmented electrode radiation detector of claim 1 in which said electrode segments are made of diffused lithium.

14. The segmented electrode radiation detector of claim 1 in which said semiconductor diode includes an outer electrode.

15. The segmented electrode radiation detector of claim 1 in which said semiconductor diode is cylindrical.

16. The segmented electrode radiation detector of claim 14 in which said outer electrode is implanted boron.

* * * * *